(12) United States Patent
Chatterjee

(10) Patent No.: US 7,285,830 B2
(45) Date of Patent: Oct. 23, 2007

(54) LATERAL BIPOLAR JUNCTION TRANSISTOR IN CMOS FLOW

(75) Inventor: Amitava Chatterjee, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/239,794

(22) Filed: Sep. 30, 2005

(65) Prior Publication Data

US 2006/0027895 A1 Feb. 9, 2006

Related U.S. Application Data

(62) Division of application No. 10/261,707, filed on Sep. 30, 2002, now Pat. No. 6,987,039.

(60) Provisional application No. 60/326,456, filed on Oct. 3, 2001.

(51) Int. Cl.
*H01L 29/76* (2006.01)

(52) U.S. Cl. ............ 257/370; 257/558; 257/592; 257/E27.015

(58) Field of Classification Search .......... 257/557, 257/556–558, 592, E27.015, 370
See application file for complete search history.

(56) References Cited

U.S. PATENT DOCUMENTS

| 4,764,482 A | 8/1988 | Hsu ................... 437/57 |
|---|---|---|
| 5,001,073 A | 3/1991 | Huie .................. 437/31 |
| 5,641,692 A * | 6/1997 | Miwa et al. ............ 438/236 |
| 5,793,085 A | 8/1998 | Vajana et al. ........... 257/370 |
| 5,841,170 A | 11/1998 | Adan et al. ............ 257/345 |
| 5,888,861 A * | 3/1999 | Chien et al. ........... 438/202 |
| 6,001,701 A | 12/1999 | Carroll et al. .......... 438/364 |
| 6,030,864 A * | 2/2000 | Appel et al. ........... 438/234 |
| 6,166,426 A * | 12/2000 | Prall et al. ............ 257/592 |
| 6,303,420 B1 * | 10/2001 | Sridhar et al. ......... 438/202 |
| 6,501,152 B1 * | 12/2002 | Johnson ............... 257/558 |
| 6,552,375 B2 * | 4/2003 | Swanson et al. ........ 257/198 |
| 6,649,983 B2 | 11/2003 | Chatterjee ............. 257/370 |

FOREIGN PATENT DOCUMENTS

EP 0 725 939 B1 12/1993

* cited by examiner

*Primary Examiner*—T. N. Quach
(74) *Attorney, Agent, or Firm*—Yingsheng Tung; Wade James Brady, III; Frederick J. Telecky, Jr.

(57) ABSTRACT

An improved lateral bipolar junction transistor and a method of forming such a lateral bipolar transistor without added mask in CMOS flow on a p-substrate are disclosed. The CMOS flow includes patterning and n-well implants; pattern and implant pocket implants for core nMOS and MOS; pattern and implants pocket implants I/O nMOS and pMOS; sidewall deposit and etch and then source/drain pattern and implant for nMOS and pMOS. The bipolar transistor is formed by forming emitter and collector contacts by implants used in source/drain regions; forming an emitter by implants done in core pMOS during core pMOS LDD extender; and forming part of an base by pocket implant steps.

10 Claims, 4 Drawing Sheets

LATERAL BIPOLAR JUNCTION TRANSISTOR IN CMOS FLOW

This is a divisional application of application Ser. No. 10/261,707 filed Sep. 30, 2002 now U.S. Pat. No. 6,987,039, which claims priority from provisional application Ser. No. 60/326,456 filed Oct. 3, 2001, the contents of which are herein incorporated by reference in its entirety.

FIELD OF THE INVENTION

This invention relates to semiconductor circuits and more particularly to an improved lateral bipolar junction transistor formed in a CMOS flow.

BACKGROUND OF THE INVENTION

Electronic equipment such as telephones, radios, televisions, games and computers comprise largely of semiconductor components. The low standby power demands of CMOS makes it especially suited for many of today's applications. Some of these semiconductor components comprise both low voltage transistors optimized for in chip processing referred to as core devices (core nMOS and core pMOS) and higher voltage devices referred to as I/O devices (I/O nMOS and I/O pMOS) optimized for between chip processing usually located near the periphery of the structure. A CMOS transistor includes source and drain regions formed in the face of the semiconductor layer with a gate insulatively disposed adjacent the face of the semiconductor layer and between the source and drain regions. The channel region between he source and drain is of opposite conductivity type to the source and drain. Pocket implants may also be formed generally self-aligned to the gate and adjacent to the source and/or drain regions. Pocket implants are of dopants that are of the same type as the channel and of opposite type as that in the source/drain. See Chatterjee et al. U.S. Pat. No. 6,287,920 B1 and Nandakumar et al. U.S. Pat. No. 6,228,725 B1 incorporated herein by reference. The high voltage MOS devices have a thicker gate oxide (for gate oxide integrity and time dependent dielectric breakdown (TDDB)) and have longer length and graded LDD (Lightly Doped Drain) implant (for channel hot carrier (CHC) reliability). The lower voltage devices use pocket implants to control the short channel threshold voltage roll off and not typically used in high voltage or I/O devices because of the longer length since control is easier and the threshold voltage will be raised (which produces undesirable CHC). See application Ser. No. 09/589,953 filed Jun. 8, 2000 of Amitava Chatterjee et al. entitled "Method to Partially or Completely suppress Pocket Implant in Selective Circuit Elements With No Additional Mask in a CMOS Flow Where Separate Masking Steps are Used for the Drain Extension Implants for the Low Voltage and High Voltage Transistors." This application is incorporated herein by reference. Also see article of A. Chatterjee et al. in Symposium of VLSI Technology pp. 147-148, in 1999 entitled "Transistor Design Issues in Integrating Analog Functions with High Performance Digital CMOS."

A typical CMOS flow includes the following steps:
1. Shallow Trench Isolation.
2. Pattern and implant p-well implants.
3. Pattern and implant n-well implants.
4. Implant damage anneal.
5. Gate Module for split gate.
6. Drain extension patterns and implants as follows not necessarily in order: pattern and implant drain extensions and pocket for core nMOS; pattern and implant drain extensions and pocket for pMOS; pattern and implant drain extensions and pocket for I/O nMOS; and pattern and implant drain extensions and pocket for I/O pMOS.
7. Sidewall deposit and etch.
8. Source/drain pattern and implant for nMOS.
9. Source/drain pattern and implant for pMOS.
10. Silicide module.
11. Contact module.
12. Dual Damascene Cu metalization module.
13. Protective Overcoat.

Bipolar transistor devices are characterized by higher switching speeds and larger output currents than MOS, but are not formed with the circuit density of MOS circuits and bipolar devices do not give the much lower standby power of MOS circuits. It is desired for many reasons to integrate bipolar and MOS devices. In one preferred application the bipolar transistor is used to build "bandgap reference" circuits. The exponential relationship between current and voltage of the bipolar transistor is utilized to generate a reference voltage. There have been many articles and patents in this area of this technology. See for, example Vittoz, IEEE JSSC June 1983, page 273 and discussion in Holman and Connelly, IEEE JSSC June 1995, p 710. There are also many patents such as U.S. Pat. No. 4,669,177 of D'Arrigo et al. and U.S. Pat. No. 6,075,272 of Prall et al. There is a desire to form bipolar junction transistors in a CMOS flow at no added cost.

There are lateral bipolar junction transistors formed in MOSFET devices with reference to p-substrate and n-well. A parasitic vertical pnp with n-well base pith p+ source/drain emitter, n-well base and p substrate collector has been produced and is illustrated in FIG. 1. The base region below the emitter contact is an n-well region. The base contact is formed by an n-well region and by the implants used in the nMOS source/drain regions. One may choose to include or omit the implants done in the core nMOS during the core nMOS Lightly Doped Drain (LDD) extender implants and pocket implants steps. Likewise one may choose to include or omit the implants used in any other nMOS in the CMOS flow such as the I/O nMOS. The emitter contact is formed by the implants used in the pMOS source/drain regions. One may choose to include or omit the implants done in the core pMOS during the core pMOS LDD extender implants and pocket implant steps. For the pMOS LDD extender implant $BF_2$ (boron and fluorine) may be used and for the pocket phosphorous implant may be used. Likewise one may choose to include or omit the implants used in any other pMOS in the CMOS flow such as the I/O pMOS. The collector region below the base is the p-substrate and the p-well region along with the implants used in the pMOS source/drain regions form the collector contact. The active regions may or may not be silicided or part of the regions may be silicided depending on the options available in the CMOS flow. Note that the pocket implants are always the opposite type as the source/drain; namely, for a pMOS the pocket is donor type while the LDD extender and the source/drain implants are acceptor type.

Another prior art bipolar device is a parasitic lateral pnp formed with p+ source/drain emitter and collector with n-well base as illustrated in FIG. 2. The emitter and collector contacts are formed by the implants used in the pMOS source/drain regions. One may choose to include or omit the implants done in the core pMOS during the core pMOS LDD extender and pocket implant steps. Likewise one may choose to include or omit the implants used in any other pMOS in the CMOS flow such as the I/O pMOS. The vertical pnp as described in FIG. 1 is present here but is considered as a parasitic device. The base region below the emitter and collector contacts is an n-well region. The base region going laterally from the emitter to the collector has the n-well and the pocket implants in the cases where the emitter and collector includes the core pMOS LDD extender and pocket implants (indicated by dashed lines). Note that the pocket implants are always the opposite conductivity type as the source/drain; namely, for a pMOS the pocket is donor type while the LDD extender and source/drain are acceptor type. The base contact is formed by an n-well region and by the implants used in the nMOS source/drain regions. One may choose to include or omit the implants done in the core nMOS during the core nMOS LDD extender and pocket implant steps. Likewise one may choose to include or omit the implants used in any other nMOS in the CMOS flow such as the I/O nMOS. The active regions may or may not be silicided or part of the regions may be silicided depending on the options available in the CMOS flow. The polysilicon may be p-type or n-type depending on the CMOS flow and how the poly is implanted. The purpose of the polysilicon is to block silicide shorting the emitter to base and to collector. In cases where the flow has a silicide block pattern then the silicide block layer such as silicon nitride can be used. The polysilicon gate is typically connected electrically to the emitter.

A third prior art bipolar device is a vertical pnp with compensated well emitter, n-well base and p-substrate collector. The base region below the emitter contact is a "compensated well" region. In a dual well CMOS flow the n-well regions are normally implanted with one set of implants and the p-well region is implanted with a second set of implants. A "compensated well" region means a region where all the implants present normally in the n-well as well as all the implants done normally in the p-well regions are superimposed. In one such process the configuration is like that in FIG. 3. The base contact is formed by an n-well region and by the implants used in the nMOS source/drain regions. One may choose to include or omit the implants done in the core nMOS during the core nMOS LDD extender implant and pocket implant steps. Likewise, one may choose to include or omit the implants used in any other nMOS in the CMOS flow such as the I/O nMOS. The emitter contact is formed by the implants used in the pMOS source/drain regions. One may choose to include or omit the implants done in the core pMOS during the core pMOS LDD extender and pocket implants steps. Likewise one may choose to include or omit the implants used in any other pMOS in the CMOS flow such as the I/O pMOS. The collector region below the base is the p-substrate and the high-energy retrograde boron implant that, in this case, is deeper than the corresponding phosphorus implant. The p-well region along with the implants used in the pMOS source/drain regions from the collector contact. The active regions may or may not be silicided or part of the regions may be silicided depending on the options available in the CMOS flow. Note that the pocket implants are always the opposite type as the source/drain; namely, for a pMOS the pocket is donor type while the LDD and source/drain are acceptor type.

A fourth is a triple well that allows several other options but this adds cost by adding more pattern and implant steps to the flow. The emitter contact is formed by the implants used in the nMOS source/drain regions. One may choose to include or omit the implants done in the core nMOS during the core nMOS LDD and pocket implant steps. Likewise one may choose to include or omit the implants used in any other nMOS in the CMOS flow such as the I/O nMOS. The base region below the emitter contact is a p-well region. The base contact is formed by the implants used in the pMOS source/drain regions. The collector region is a deep n-well region formed, for example, by a high energy implant. The collector contact is formed by an n-well region and by the implants used in the nMOS source/drain regions. The active regions may or may not be silicided or part of the regions may be silicided depending on the options available in the CMOS flow. Note that the pocket implants are always the opposite type as the source/drain ; namely, for a pMOS the pocket is donor type while the LDD and the source/drain are acceptor type. The triple well (p-well, n-well, and deep n-well) process allows more bipolar structures than the one shown in FIG. 4.

It is highly desirable to provide an improved bipolar transistor with graded base without added mask in CMOS flows

SUMMARY OF THE INVENTION

In one embodiment of the present invention an improved lateral bipolar transistor is provided without added mask in CMOS flow with a graded base.

DESCRIPTION OF THE DRAWING

FIG. 6b illustrates formation of core LDD and pocket implants with photoresist for embodiment of FIG. 6a.

FIG. 6c illustrates formation of I/O LDD extender with photoresist for embodiment of FIG. 6a.

FIG. 7 illustrates the graded base along the lateral surface between the base and emitter of FIG. 6a.

DESCRIPTION OF THE PREFERRED EMBODIMENTS

Currently there are CMOS fabrication steps that include forming both high voltage devices with thick gate oxides located usually about the periphery of the semiconductor chip and lower power devices with thinner gate oxide thickness. These higher voltage devices are referred to as I/O devices and the lower voltage devices are referred to as core devices.

Figure 5:
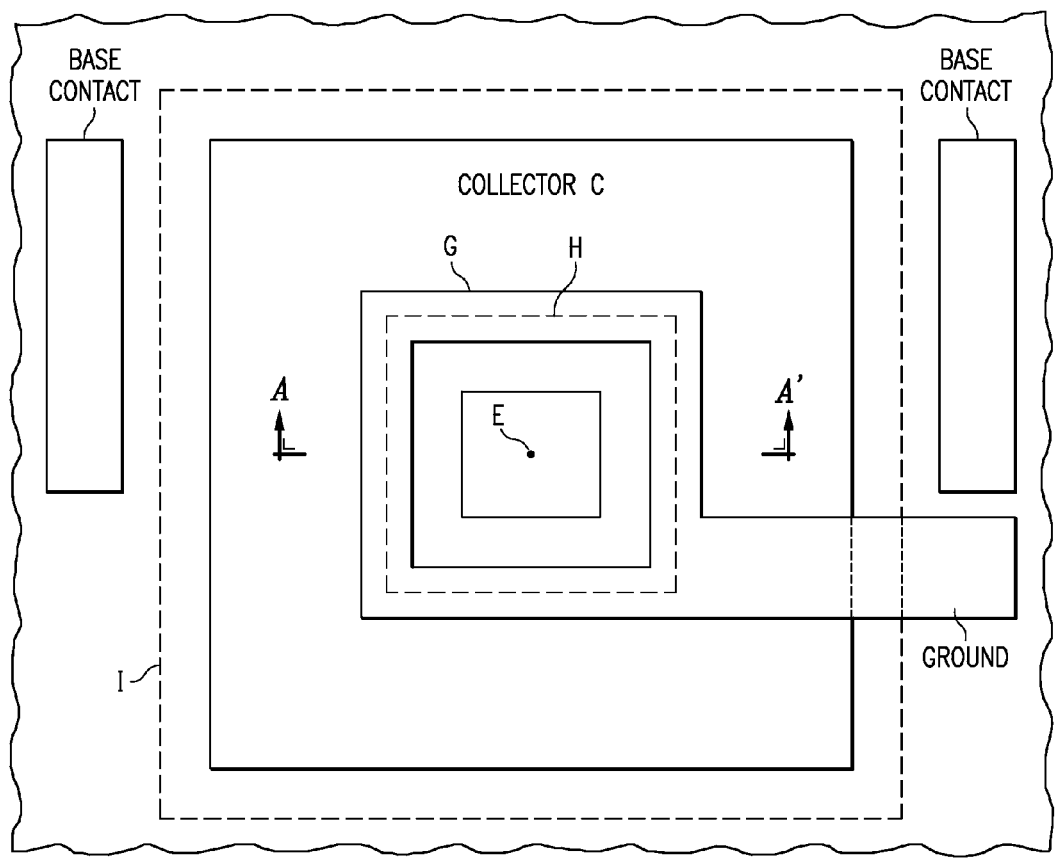
FIG. 5 is a top plan view of the structure according to one embodiment of the present invention.
Figure 6A:
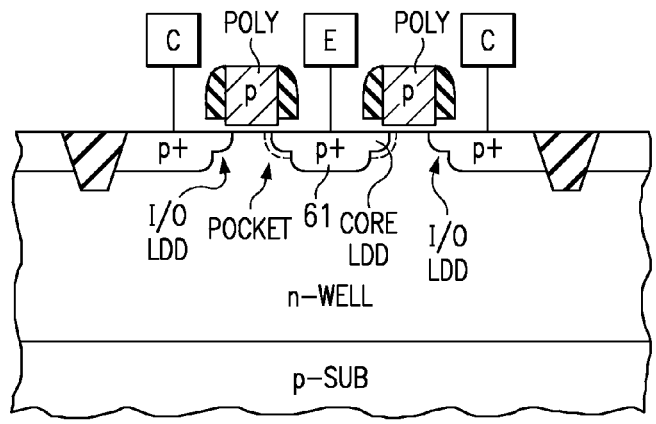
FIG. 6a illustrates a sectional view of FIG. 5 according to a first embodiment of the present invention.

In accordance with one preferred embodiment of the present invention illustrated in FIGS. 5 and 6a, a lateral bipolar transistor is formed with the p+ core source/drain implants as the emitter and the n-pocket implant as the base and a graded p-LDD extender of the I/O implant as the collector. The base is covered by a silicide blocking layer such as polysilicon to prevent the junctions from being silicided. The structure is formed in an n-well.

In FIG. 5 the emitter E is in the center, a ring of poly G forms the gate (over the base) and the collector C is the outer ring. The gate G is formed in the fabrication step 5 discussed in the background. The polysilicon gate G may be connected to the emitter to ensure that the parasitic MOS transistor is off. The gate oxide thickness may be either core thickness or I/O thickness. It is preferably I/O thickness. The structure is similar to an asymmetric "analog friendly" MOSFET, except that it is being laid out like a bipolar junction transistor and the gate oxide thickness need not be the core oxide thickness. This structure is described in application Ser. No. 09/589,953 filed Jun. 8, 2000 of Amitava Chatterjee et al. entitled "Method to Partially or Completely suppress Pocket Implant in Selective Circuit Elements With No Additional Mask in a CMOS Flow Where Separate Masking Steps are Used for the Drain Extension Implants for the Low Voltage and High Voltage Transistors." This application is incorporated herein by reference. Also see article of A. Chatterjee et al. in Symposium of VLSI Technology pp. 147-148, in 1999 entitled "Transistor Design Issues in Integrating Analog Functions with High Performance Digital CMOS." This asymmetric structure gives a graded base bipolar function transistor and a lightly doped collector-base junction.

Figure 6B:
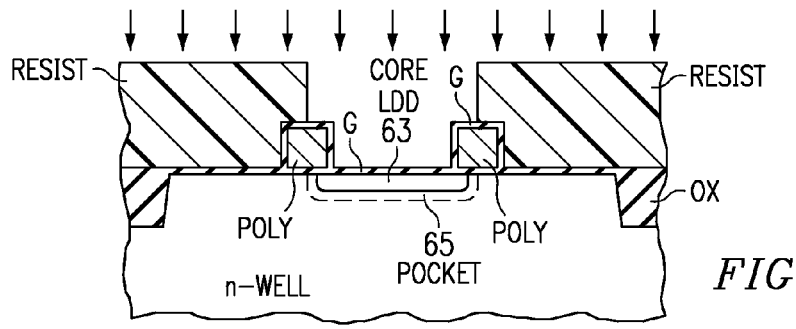
Figure 6C:
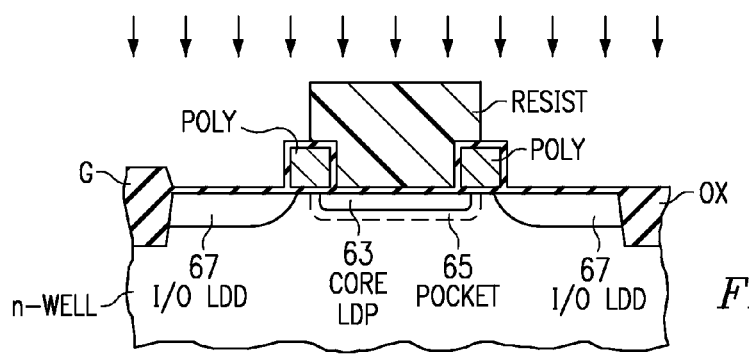
Figure 7:
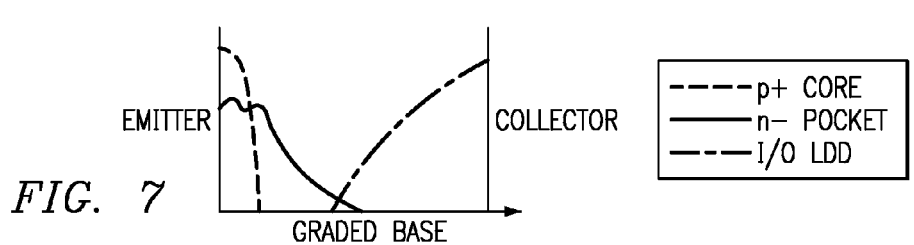

Referring to FIG. 6a there is illustrated by cross section the asymmetric lateral pnp structure of FIG. 5 according to one embodiment of the present invention. The emitter and collector contacts are formed by the implants used in the pMOS source drain regions. The emitter includes the implants done in the core pMOS (represented by the p+ region 61) during the core pMOS extender LDD (represented by tabs 63) and pocket implant (represented by dashed lines 65) in step 6. FIG. 6b illustrates the cross section between A-A' in FIG. 5 during the core LDD extender and pocket implants. The areas between dashed lines H and I in FIG. 5 are covered by photoresist leaving the area open between the poly gates. The LDD extender implant is under the gate oxide and only slightly under the poly gate while the pocket extender represented by dashed lines extends further under the gate or base. The collector omits the core pMOS LDD extender and pocket implants in Step 6 of the CMOS flow described in the background of the invention. In a first preferred embodiment embodiment an I/O MDD extender represented by 67 in FIGS. 6a and 6c is included in the collector in Step 6. FIG. 6c illustrates the cross section A-A' in FIG. 5 during the I/O collector implants wherein photoresist covers the central area between the middle of the gates leaving the region between dashed lines H and I in FIG. 5 open for implanting the I/O LDD extender 67. The base region below the emitter and collector contacts is an n-well region. The base region going laterally from the emitter to the collector has the n-well and the pocket implants. Note that the pocket implants are always the opposite type as the source/drain; namely, for a pMOS the pocket is donor type such as phosphorous while the I/O LDD extender and source/drain are acceptor type such as boron. The base contact is formed by an n-well region and by the implants used in the nMOS source/drain regions. One may choose to include or omit the implants done in the core nMOS during the core nMOS LDD extender and pocket implant steps. Likewise one may choose to include or omit the implants used in any other nMOS in the CMOS flow such as the I/O nMOS. The active regions may or may not be silicided or part of the regions may be silicided depending on the options available in the CMOS flow. The polysilicon may be p-type or n-type depending on the CMOS flow and how the poly is implanted. The purpose of the polysilicon is to block silicide which would otherwise short the emitter to base and to collector. In cases where the flow has a silicide block pattern then the silicide block layer can be used. The gate oxide may be the core gate oxide or the I/O gate oxide. This asymmetric structure provides a graded base bipolar junction transistor and a lightly doped collector-base junction illustrated in FIG. 7. The base region between the emitter and collector along the lateral surface of the wafer is graded. Starting from the emitter and going to the collector is the P+ at the core to the n-pocket (represented by the dashed lines in FIG. 6a-6c) and to the I/O LDD extender at the collector.

Figure 8:
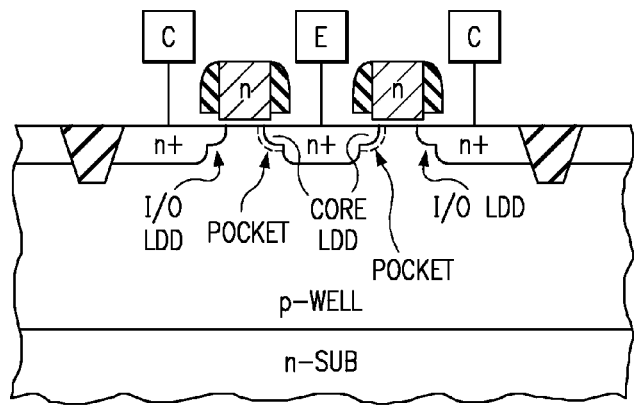
FIG. 8 illustrates a sectional view of FIG. 5 according to the first embodiment of the present invention using opposite conductivity type material than in FIGS. 6a-6c.

FIG. 8 illustrates the embodiment of FIG. 6 with opposite conductivity type material for npn transistor with an n-substrate, p-well and the emitter and collector contacts are formed in nMOS source/drain regions. The base region below the emitter and collector is a p-well region. The base region going from the emitter to the collector has the p-well and the pocket implants that are of the opposite conductivity type to the source/drain or in this nMOS case the pocket is p or acceptor type. The emitter includes the core LDD extender and the collector has the I/O extender.

Figure 9:
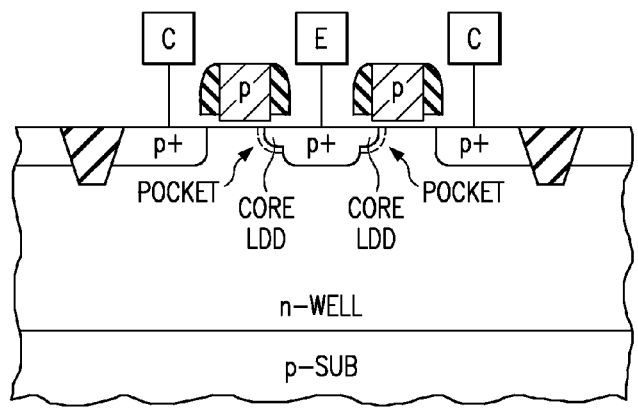
FIG. 9 illustrates a sectional view of FIG. 5 according to a second embodiment of the present invention.

FIG. 9 illustrates a second asymmetrical lateral pnp embodiment according to a second embodiment of the present invention. The emitter and collector contacts are formed by the implants used in the pMOS source/drain regions. The emitter includes the implants done in the core pMOS during the core pMOS LDD extender and pocket implant steps described in the background in CMOS flow Step 6 whereas the collector omits the core pMOS LDD extender and pocket implants. In this embodiment the collector does not include any LDD extender implants: namely, it is formed by the source/drain implants in Step 9 of the CMOS flow which is done after the spacer formation in Step 7. The base region below the emitter and collector contacts is an n-well region. The base region going laterally from the emitter to the collector has the n-well and the pocket implants. Note that the pocket implants are always the opposite type as the source/drain; namely, for a pMOS the pocket is donor type while the LDD and source/drain are acceptor type. The base contact is formed by an n-well region and by the implants used in he nMOS source/drain regions. One may choose to include or omit the implants done in the core nMOS during the core nMOS LDD extender and pocket implant steps. Likewise one may choose to include or omit the implants used in any other nMOS in the CMOS flow such as the I/O nMOS. The active regions may or may not be silicided or part of the regions may be silicided depending on the options available in the CMOS flow. The polysilicon may be p-type or n-type depending on the CMOS flow and how the poly is implanted. The purpose of the polysilicon is to block silicide shorting the emitter to base and to collector. In cases where the flow has a silicide block pattern then the silicide block layer can be used. The gate oxide may be the core gate oxide or the I/O gate oxide.

The opposite conductivity type configuration for the embodiment of FIG. 9 would be like that shown and described in FIG. 8 without the collector I/O LDD extender.

Figure 10:
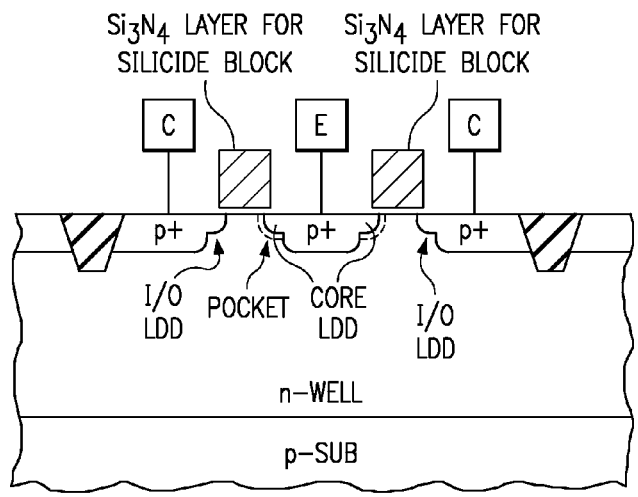
FIG. 10 illustrates an embodiment with a silicide block layer.

FIG. 10 illustrates the embodiment of FIG. 6a with a nitride silicide block layer. Note that the region below the silicide block layer is not the gate oxide as in the embodiment of FIG. 6a with poly. For the embodiment for FIG. 6a it was the gate oxide of either the core or the I/O. The silicide module involves a pattern and etch of a silicide block layer. The silicide block may be implemented in two ways.

In a first way, a thin film, eg. 20 nm of silicon nitride ($Si_3N_4$), to block silicide is deposited after step 9 discussed above in the CMOS flow, namely, after the source/drain implants are done. This is then followed by the silicide block pattern and etch to leave the film in regions where we want to block silicidation.

Alternatively, one could use the films already deposited to form the MOSFET sidewalls as the silicide block layer. In that case Step 7, i.e., the sidewall deposit and etch will be modified to insert the silicide block pattern between the sidewall deposition and the sidewall etch. This pattern will leave the silicide block layer (which in this case is the same as the films deposited for the sidewall formation) in regions where we want the block silicidation.

Figure 1:
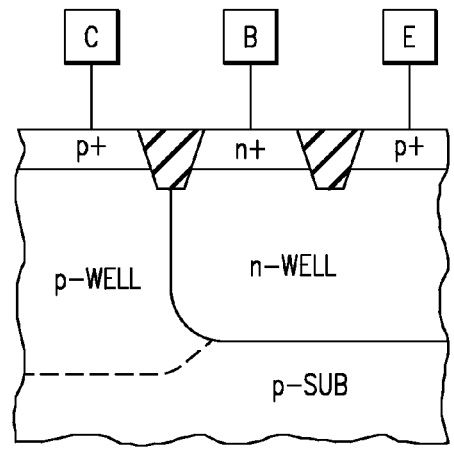
FIG. 1 illustrates a prior art vertical pnp with n-well base.

Compared to the prior art in FIG. 1 the present invention has higher gain because the base width and base Gummel number can be smaller. Typically, the n-well depth is about 1.5 um while the base width of the lateral pnp can easily be <0.5 um. Likewise, the base Gummel number can be several times lower in the lateral asymmetric device relative to the price art.

Figure 2:
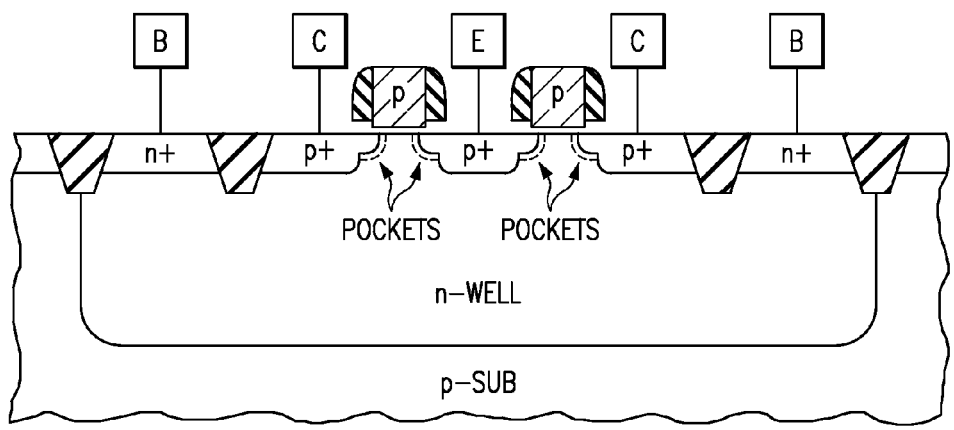
FIG. 2 illustrates a prior art lateral pnp with n-well base with LDD extenders and pockets.

Compared to the prior art of FIG. 2 the asymmetric device has a higher gain and is also faster (lower base transit time) because the lateral base doping profile has the same shape as that of a classic graded base bipolar transistor. For the same Lpoly (or Lsilicide block if silicide block layer is used instead of poly) the base Gummel number will be substantially less than that of the symmetric device in the case where the pocket is used in both the collector and the emitter of the symmetric device of prior art of FIG. 2 simply because the pocket is omitted from one end of the present invention. Furthermore, the collector with the I/O LDD (as well as the case where the collector includes only the source drain implants done after spacer formation results in a graded collector-to-base junction relative to the abrupt collector-to-base junction formed in the case of prior art 2 using core LDD extender and pocket implants-in the collector. The advantage of this type of asymmetric profile (graded at collector-to-base and abrupt junction at emitter-to-base) allows for a better tradeoff between Early Voltage and current gain. Typically, higher current gain leads to lower Early Voltage. Both high current gain and high Early Voltage are desirable.

Figure 3:
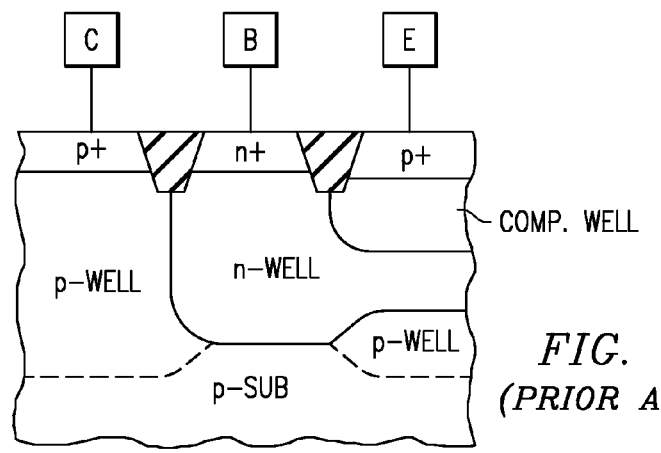
FIG. 3 illustrates a prior art vertical pnp with compensated well.

Compared to the prior art in FIG. 3 the present invention has the advantage of having all three terminals (E, B and C) to be isolated from the substrate. This advantage also applies to the prior art embodiment of FIG. 1. In the prior art of FIG. 3 the substrate is the collector and hence it's potential is restricted to be the substrate potential of the integrated circuit. This severely limits the use of the component.

Figure 4:
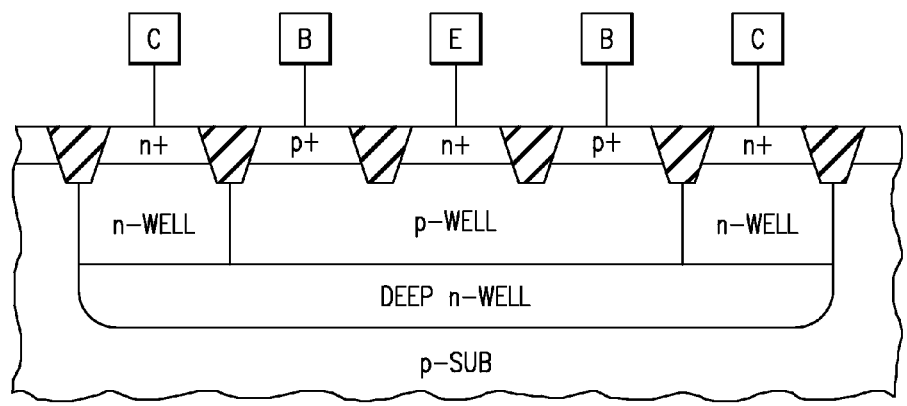
FIG. 4 illustrated a prior art vertical npn with triple well.

The prior art of FIG. 4 involves a triple well process. Hence, it has the extra cost associated with forming the deep well in selected regions on the wafer.

In alternative embodiments the collector may be drain of a Drain Extended MOS (DEMOS). See J. C. Mitros, et al., "High Voltage Drain Extended MOS Transistors for 0-18 µm Logic CMOS Process", IEEE Transactions on Electron Devices, Vol. 48, pp. 1751-1755, August 2001. Silicide block emitters, I/O gate oxide, n-poly PMOS options may be used to enhance performance.

What is claimed is:

1. A semiconductor circuit component; comprising:
   a lateral bipolar transistor having a base region comprising a well region having a well implant profile of a first polarity;
   a gate structure over the base region and electrically isolated from the base region;
   an emitter region comprising a core drain extension region having a core drain extension implant profile of a second polarity opposite the first polarity;
   an collector region comprising an I/O drain extension region having an I/O drain extension implant profile of the second polarity and different from the core drain extension implant profile;
   an emitter contact region contacting the emitter region and a collector contact region contacting the collector region comprising a source/drain region with an source/drain implant profile of the second polarity and different from the core drain extension implant profile and the I/O drain extension implant profile;
   a portion of the base region adjacent to the emitter region comprising a pocket-implant region having a pocket-implant profile of the first polarity; and
   a corresponding portion of the base region adjacent to the collector region free of the pocket-implant region and the pocket-implant profile.

2. The semiconductor circuit component of claim 1; in which the first polarity is n-type and the second polarity is p-type.

3. The semiconductor circuit component of claim 1; in which the first polarity is p-type and the second polarity is n-type.

4. The semiconductor circuit component of claim 1; in which the gate structure includes polysilicon.

5. The semiconductor circuit component of claim 4; in which the gate structure further includes silicide.

6. The semiconductor circuit component of claim 1; in which the gate structure includes metallic material.

7. The semiconductor circuit component of claim 1; further comprising MOS transistors.

8. The semiconductor circuit component of claim 7; in which the MOS transistors include an I/O device and a core device.

9. The semiconductor circuit component of claim 1; in which the gate structure includes nitride silicide block layer.

10. The semiconductor circuit component of claim 1; further comprising a semiconductor substrate which is electrically isolated from the emitter contact region and the collector contact region.

* * * * *